(12) United States Patent
Alaan et al.

(10) Patent No.: US 12,733,477 B2
(45) Date of Patent: Sep. 8, 2026

(54) DAMASCENE INTERCONNECT STRUCTURES WITH LOW RESISTANCE VIAS FOR INTEGRATED CIRCUITS

(71) Applicant: Intel Corporation, Santa Clara, CA (US)

(72) Inventors: Urusa Alaan, Hillsboro, OR (US); Kevin L. Lin, Beaverton, OR (US); Miriam Reshotko, Portland, OR (US); Sarah Atanasov, Beaverton, OR (US); Christopher Jezewski, Portland, OR (US); Carl Naylor, Portland, OR (US); Mauro Kobrinsky, Portland, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 842 days.

(21) Appl. No.: 17/033,375

(22) Filed: Sep. 25, 2020

(65) Prior Publication Data

US 2022/0102268 A1 Mar. 31, 2022

(51) Int. Cl.
*H10W 20/42* (2026.01)
*H10W 20/00* (2026.01)

(52) U.S. Cl.
CPC ......... *H10W 20/42* (2026.01); *H10W 20/085* (2026.01); *H10W 20/086* (2026.01)

(58) Field of Classification Search
None
See application file for complete search history.

(56) References Cited

U.S. PATENT DOCUMENTS

2010/0176513 A1* 7/2010 Agarwala ......... H01L 21/76885 438/622
2019/0259658 A1* 8/2019 Yang ................. H01L 23/53295
2020/0006131 A1* 1/2020 Shimabukuro ... H01L 21/76814

OTHER PUBLICATIONS

Lee, JP 2003197739, Semiconductor Device and ITS Forming Method, 2003. (Year: 2003).*

* cited by examiner

*Primary Examiner* — Alexander G Ghyka
(74) *Attorney, Agent, or Firm* — Essential Patents Group, LLP

(57) ABSTRACT

Integrated circuit interconnect structures including a metallization line with a bottom barrier material, and a metallization via lacking a bottom barrier material. Barrier material at a bottom of the metallization line may, along with barrier material on a sidewall of the metallization line, mitigate the diffusion or migration of fill metal from the line. An absence of barrier material at a bottom of the via may reduce via resistance and/or facilitate the use of a highly resistive barrier material that may enhance the scalability of interconnect structures. A number of masking materials and patterning techniques may be integrated into a dual damascene interconnect process to provide for both a barrier material and a low resistance via unburden by the barrier material.

14 Claims, 14 Drawing Sheets

301
965
615
760
615
y
B
B'
x 301
965
760
615
555
440
335
550
T2
330
330
T1
550
315
310
306
305
z
B
B'
x 301
615
440
965
615
B
B'
y
x 965
760
301
615
555
440
335
T2
550
330
W2
330
T1
550
W2
315
440
310
306
305
z
B
B'
x

DAMASCENE INTERCONNECT STRUCTURES WITH LOW RESISTANCE VIAS FOR INTEGRATED CIRCUITS

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay associated with interconnects of an IC increases with the density of the interconnects.

FIG. 1A illustrates a conventional interconnect structure that includes a metal line 101 within a first interconnect level. A transverse width of metal line 101 has some lateral critical dimension CD1. A dielectric material 102 is over metal line 101, and a "via" 103 is subtractively patterned through dielectric material 102 in the z-dimension to expose a portion of metal line 101. Via 103 has a depth $D_V$ associated with the thickness of dielectric material 102. A diameter of via 103 has some lateral critical dimension CD2. Often, CD2 is made smaller than CD1 by an amount sufficient to ensure via 103 will land upon metal line 101. The ratio of depth $D_V$ to CD2 is referred to as the aspect ratio of via 103. Metal line width CD1 scales down as metal line density increases with increasing transistor density, and so CD2 must also scale down and the aspect ratio of via 103 increases.

As further illustrated in FIG. 1B, via 103 and trench 106 is filled with one or more metals to form a metal line 108 within a second interconnect level. Metal line 108 extends in the x-y dimension of the second interconnect level to intersect conductive material in via 103 so that the first and second interconnect levels are electrically connected. In this example, a barrier material 105 is on surfaces of trench 106 and via 103. The barrier material is to prevent diffusion/migration of a fill material 107 out of the interconnect structure, as any loss of fill material 107 is generally catastrophic to an integrated circuit. Barrier material 105 has significantly higher electrical resistance than fill material 107. As structural dimensions scale, barrier material 105 threatens to become a greater portion of an interconnect structure, leading to higher interconnect resistances.

As shown in FIG. 1B, there is a barrier material portion 105A in contact with a via sidewall of dielectric material 102 while, and a barrier material portion 105B on a bottom of via 103. Barrier material portion 105C is similarly in contact with a trench sidewall of dielectric material 102, and barrier material portion 105D is on a bottom of trench 106. Barrier material portion 105B, being at the intersection of via 103 and line 101, is disadvantageous because there is little need for a diffusion barrier in this specific location and electrical resistance between via 103 and line 101 is significantly increased by barrier material portion 105B, particularly if barrier material is a dielectric or otherwise presents a high electron tunneling barrier.

With damascene metallization technology, fill material 107 is deposited (e.g. plated) into trench 106. In duel-damascene techniques, both via 103 and overlying trench 106 are etched into dielectric material 102 and then lined with the barrier material and filled concurrently. For such techniques, it is non-trivial to fabricate an interconnect structure that includes some portions of barrier material 105, such as barrier material portion 105D, but is also unburdened by barrier material portion 105B.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
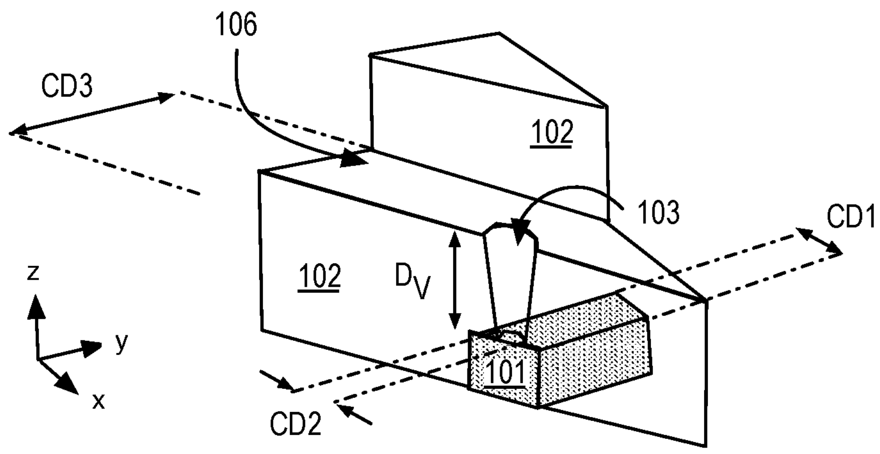
FIGS. 1A and 1B illustrate isometric cross-sectional views of an IC interconnect structure, in accordance with convention.
Figure 1B:
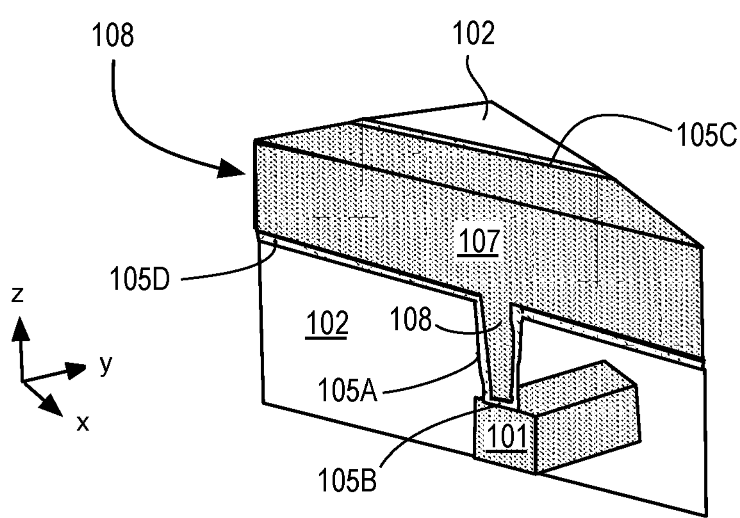

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase “in an embodiment” or “in one embodiment” or “some embodiments” in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms “a”, “an” and “the” are intended to include the plural forms as well, unless the context clearly indicates otherwise. It will also be understood that the term “and/or” as used herein refers to and encompasses any and all possible combinations of one or more of the associated listed items.

The terms “coupled” and “connected,” along with their derivatives, may be used herein to describe functional or structural relationships between components. It should be understood that these terms are not intended as synonyms for each other. Rather, in particular embodiments, “connected” may be used to indicate that two or more elements are in direct physical, optical, or electrical contact with each other. “Coupled” may be used to indicated that two or more elements are in either direct or indirect (with other intervening elements between them) physical or electrical contact with each other, and/or that the two or more elements co-operate or interact with each other (e.g., as in a cause and effect relationship).

The terms “over,” “under,” “between,” and “on” as used herein refer to a relative position of one component or material with respect to other components or materials where such physical relationships are noteworthy. For example in the context of materials, one material or layer disposed over or under another may be directly in contact or may have one or more intervening materials or layers. Moreover, one material disposed between two materials or layers may be directly in contact with the two materials/layers or may have one or more intervening materials/layers. In contrast, a first material or layer “on” a second material or layer is in direct contact with that second material/layer. Similar distinctions are to be made in the context of component assemblies.

As used throughout this description, and in the claims, a list of items joined by the term “at least one of” or “one or more of” can mean any combination of the listed terms. For example, the phrase “at least one of A, B or C” can mean A; B; C; A and B; A and C; B and C; or A, B and C.

Described below are examples of integrated circuit interconnect structures that include a metallization line with a bottom barrier material, and a metallization via that lacks a bottom barrier material. Barrier material at a bottom of the metallization line may, along with barrier material on a sidewall of the metallization line, mitigate the diffusion or migration of fill metal from the line. Regardless of the composition of the barrier material, its absence from the bottom of the via may reduce via resistance. Without a bottom barrier material, via resistance is less dependent on the composition of barrier material and the barrier material is free to be a more resistive material, such as a dielectric or two-dimensional material that may function as a barrier at reduced thicknesses and thereby also enhance the scalability of interconnect structures.

As described below, a number of masking materials and patterning techniques may be integrated into a dual damascene interconnect process to fabricate a barrier material in a manner that frees a bottom of a via of barrier material. Once the barrier material has been limited to only those regions of an interconnect structure where a diffusion barrier is most advantageous, a metal fill and planarization process may then complete a damascene interconnect metallization structure having low resistance vias.

Figure 2:
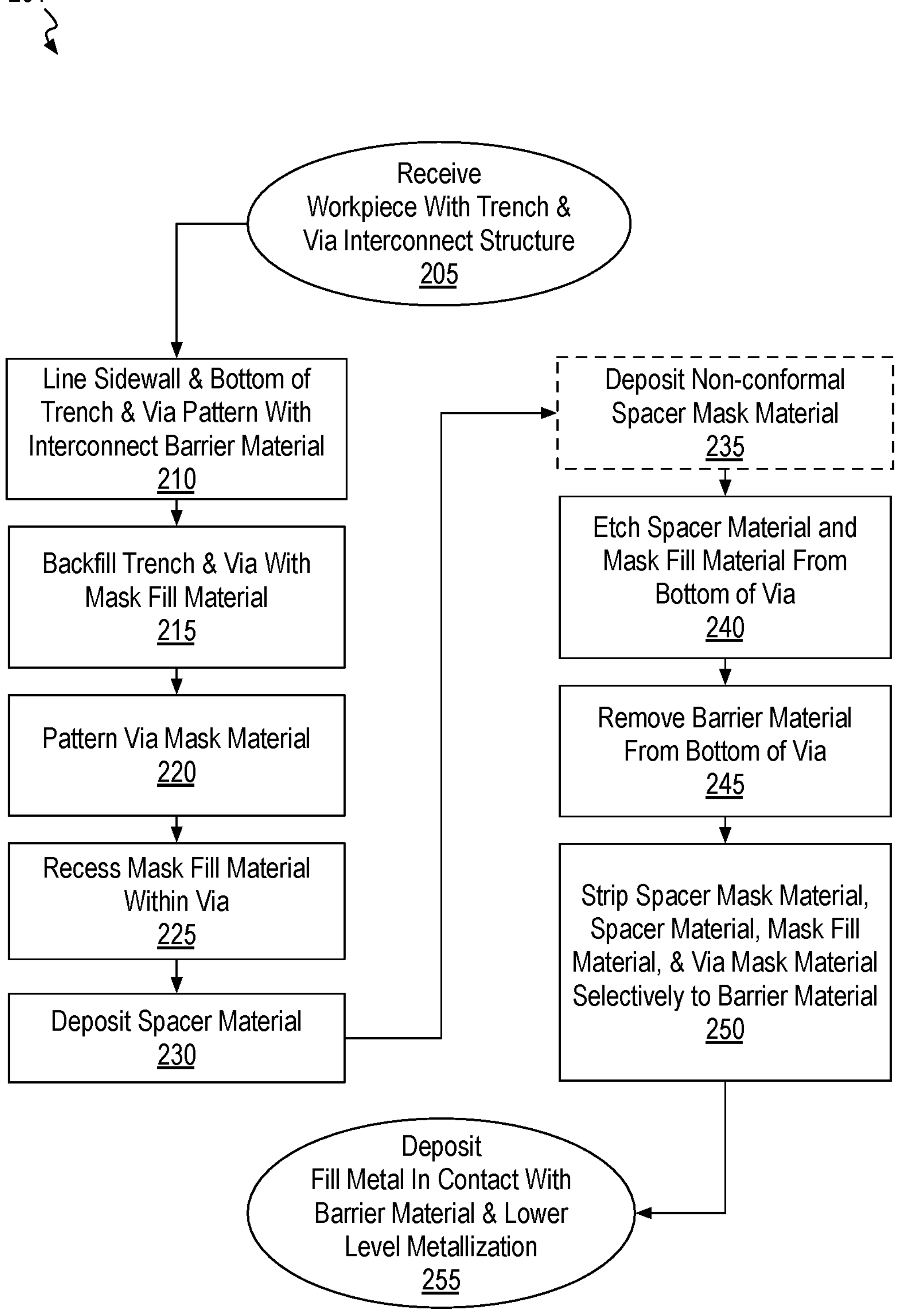
FIG. 2 is a flow chart of methods of fabricating an IC interconnect structure with a low-resistance via, in accordance with some embodiments.

FIG. 2 is a flow chart of methods 201 for fabricating integrated circuit interconnect structures with a low resistance via, in accordance with some embodiments. FIG. 3A-12A illustrate a plan view of an interconnect structure portion 301 evolving as methods 201 are practiced, in accordance with some embodiments. FIG. 3B-12B illustrate a cross-sectional view of a portion of interconnect structure portion 301 along the B-B' line depicted in FIG. 3A-12A, respectively.

Referring first to FIG. 2, methods 201 begin at input 205 where a workpiece having a trench and via interconnect pattern within one or more dielectric materials, is received. The trench and via interconnect structure may be any “dual-damascene” type structure that has been subtractively patterned into any dielectric material(s) suitable as an interlayer dielectric material (ILD). In some embodiments, the workpiece includes a semiconductor wafer, such as a large format (e.g., 300-450 mm) wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more underlying device layers including a semiconductor material layer, and may also have one or more interconnect levels interconnecting devices (e.g. transistors) of the devices layers. As received at input 205, the work surface of the workpiece comprises ILD material over any number of underlying device or interconnect levels.

Figure 3A:
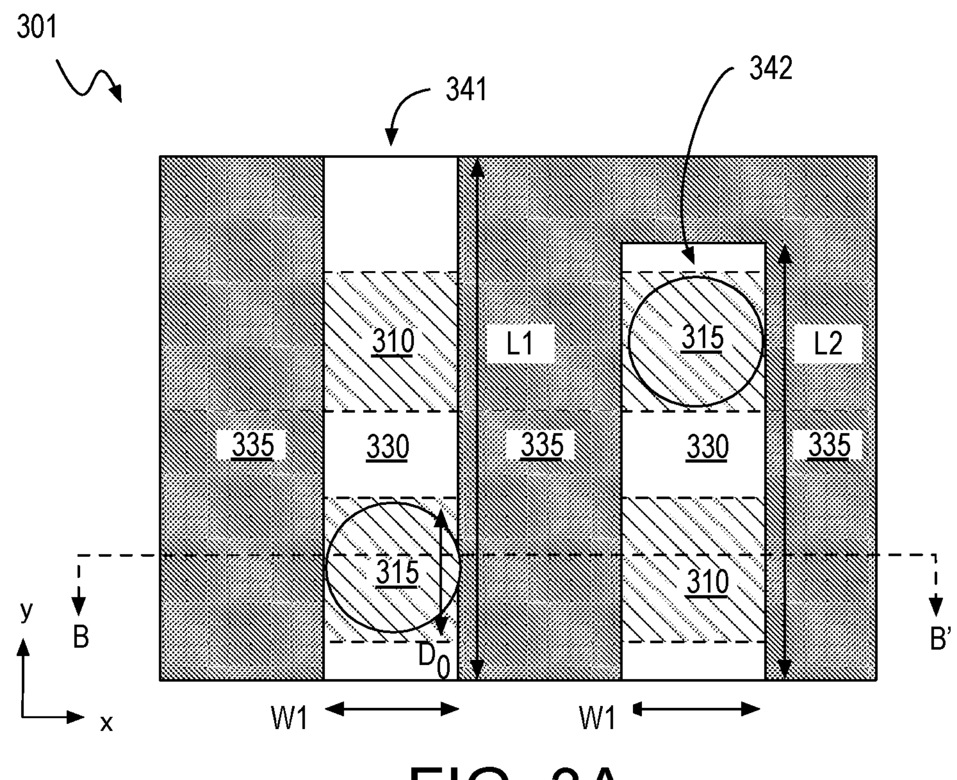
FIGS. 3A, 4A, 5A, 6A, 7A, 8A, 9A, 10A, 11A and 12A illustrate a plan view of a portion of an IC interconnect structure evolving as the methods illustrated in FIG. 2 are practiced, in accordance with some embodiments.
Figure 3B:
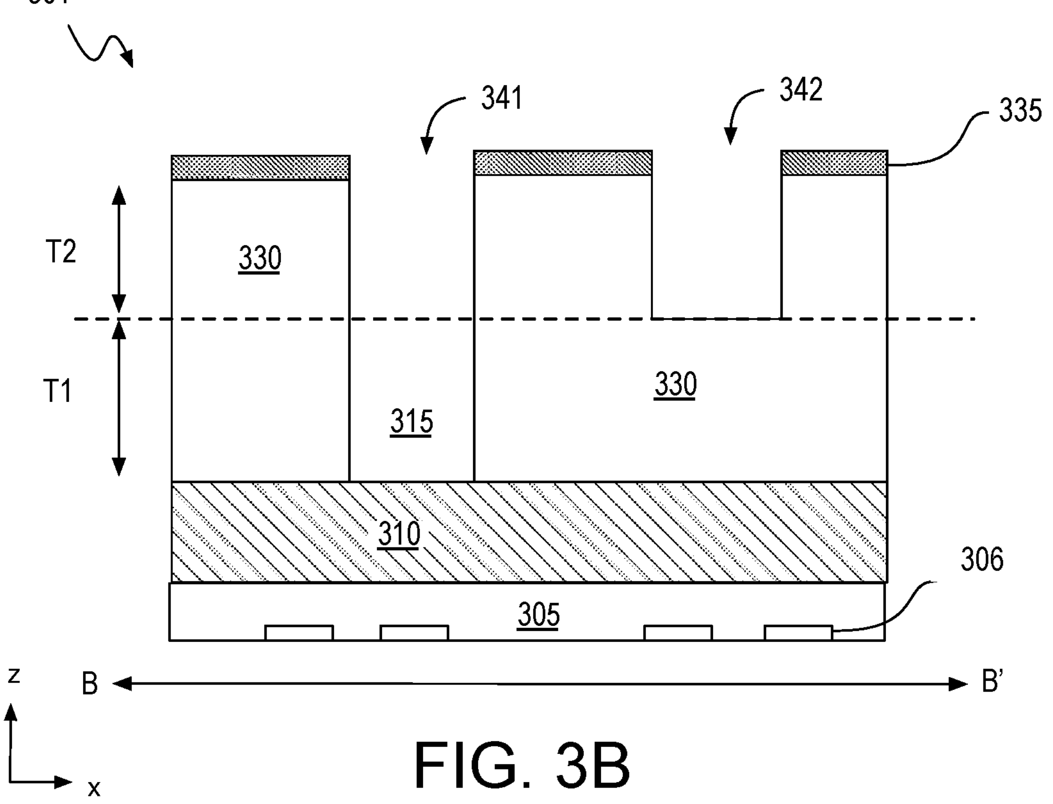
FIGS. 3B, 4B, 5B, 6B, 7B, 8B, 9B, 10B, 11B and 12B illustrate a cross-sectional view of a portion of an IC interconnect structure evolving as the methods illustrated in FIG. 2 are practiced, in accordance with some embodiments.

In the example shown in FIG. 3A and FIG. 3B, interconnect structure portion 301 includes a via 315 extending through a thickness T1 of one or more dielectric materials 330. Thickness T1 may vary with implementation, but in some exemplary embodiments is 10 nm-50 nm. An underlying metallization feature (e.g., a line) 310 is exposed at a bottom of via 315. Metallization feature 310 is in a lower interconnect level below dielectric materials 330. Metallization feature 310 may have any composition, with some examples including copper, tungsten, titanium, cobalt, ruthenium, manganese, or aluminum. In FIG. 3A, metallization feature 310 is drawn in dashed line as being below the surface.

Interconnect structure portion 301 further includes trench 341 over via 315, within a thickness T2 of dielectric materials 330. Thickness T2 may vary with implementation, but in some exemplary embodiments is 10-50 nm, or more. Another trench 342 laterally spaced apart from trench 341 is further illustrated, and the cross-section of trench 342 shown in FIG. 3B is representative of a cross-section of trench 341 out of the plane of the FIG. 3B where there is no via 315. As shown in FIG. 3A, trench 341 has a longitudinal length $L_1$ and a transverse width $W_1$. In exemplary embodiments, longitudinal length $L_1$ is significantly (e.g., 3×) larger than transverse width $W_1$. Although not illustrated, trench 341 has ends somewhere beyond the perimeter of interconnect structure portion 301. Trench 342 is substantially parallel to trench 341, but with a shorter longitudinal length $L_2$ to further illustrate a trench end. An etch stop material layer 335 is over dielectric materials 330, surrounding trenches 341, 342. Via 315 has a maximum lateral diameter $D_0$, which may vary with implementation, but is generally significantly smaller than the length of a trench (e.g., diameter $D_0$ is significantly smaller than longitudinal lengths $L_1$ and $L_2$).

Any single-step or multi-step anisotropic reactive ion etch (RIE) process (e.g., based on a $C_xF_y$ plasma chemistry) may have been practiced to form trenches 341, 342 and via 315, as embodiments are not limited in this respect. Although trenches 341, 342, and via 315, are depicted with ideal profiles having substantially vertical (e.g., z-dimension) sidewalls, it is appreciated that trenches 341, 342 and/or via 315 may instead have less idealized profiles, for example with tapered sidewall slopes and a top width being slightly larger than a bottom width.

Dielectric materials 330 may include any dielectric material suitable for electrical isolation of integrated circuitry. Dielectric materials 330, may, for example, be a low-k dielectric material (e.g., SiOC) having a relative permittivity below 3.5. In other examples, dielectric materials 330 may be any of SiO, SiON, hydrogen silsesquioxane, methyl silsesquioxane, polyimide, polynorbornenes, benzocyclobutene, or the like. Dielectric materials 330 may be deposited as a flowable oxide, for example, and have a substantially planar top surface. Etch stop material layer 335 may also be a dielectric material, but advantageously has a different composition than dielectric materials 330. Etch stop material layer 335 may have a somewhat higher relative permittivity than dielectric materials 330, for example. Etch stop material layer 335 may have any composition such as, but not limited to, SiN, SiO, SiON, $HfO_2$, ZrO, $Al_2O_3$, for example. Etch stop material layer 335 may have any thickness, but in some advantageous embodiments has a thickness less than 10 nm, and advantageously no more than 5 nm (e.g., 2-3 nm, etc.). In accordance with some further embodiments, dielectric materials 330 may further include an intervening trench etch stop material layer (not depicted) between dielectric material thicknesses T1 and T2.

As further shown in FIG. 3B, interconnect structure portion 301 is over a portion of an underlying substrate that includes a device layer 305. Within device layer 305 are a plurality of devices 306. In exemplary embodiments, devices 306 are metal-oxide-semiconductor field effect transistor (MOSFET) structures. However, devices 306 may also be other transistor types, such as, but not limited to other FET architectures, or bipolar junction transistors. Devices 306 may also be other devices that include one or more semiconductor junctions (e.g., diodes, etc.).

Returning to FIG. 2, methods 201 continue at block 210 where a sidewall and bottom of trench and via features are lined with barrier material. The barrier material may be formed with any process suitable for the barrier material composition. In one example, a conformal deposition process, such as atomic layer deposition (ALD), may be practiced at block 210. A chemical surface treatment or any reactive doping process may also be practiced at block 210. Any barrier material known to be suitable for forming a diffusion barrier, such as, but not limited to Ta, TaN, metal chalcogenides, or graphene, may be formed at block 210. The barrier material may be formed to any suitable thickness (e.g., 2 nm, or more). In some exemplary embodiments, the barrier layer is formed to a thickness of no more than 1.5 nm. Because of their minimal thickness, for example corresponding to only 1-2 monolayers of material, such barrier materials may be referred to as two-dimensional (2D). Some examples of 2D barrier materials include metal chalcogenides or graphene. Dielectric barrier materials, such as SiO, SiN, SiON, $Al_2O_3$, $HfO_2$, or $ZrO_2$ are also possible as these materials at relatively low thickness can also inhibit out migration of a fill metal.

Figure 4A:
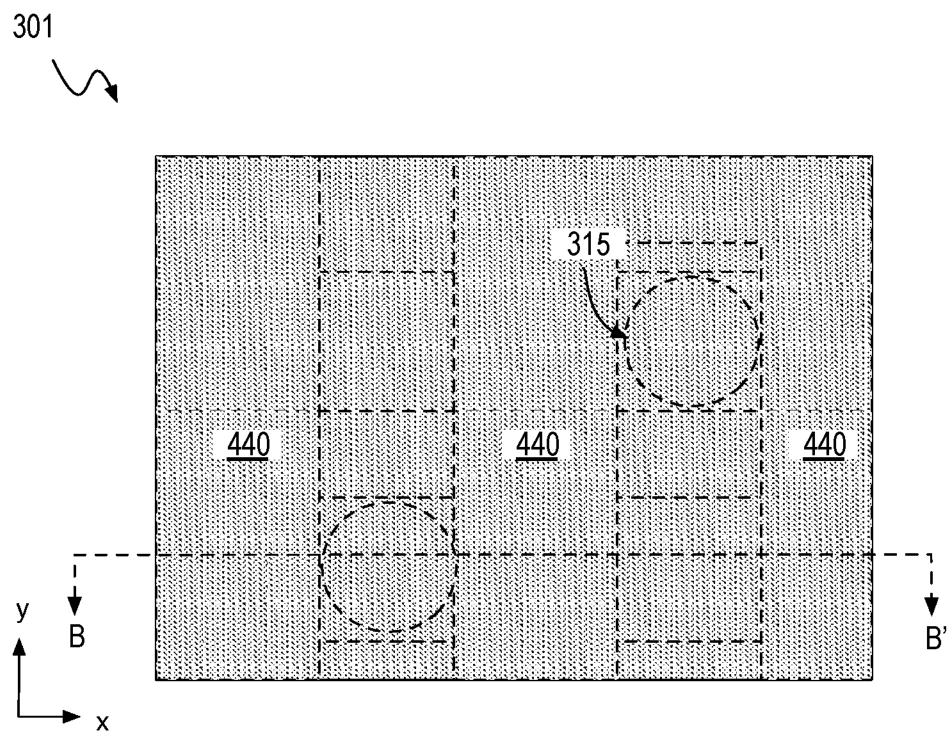
Figure 4B:
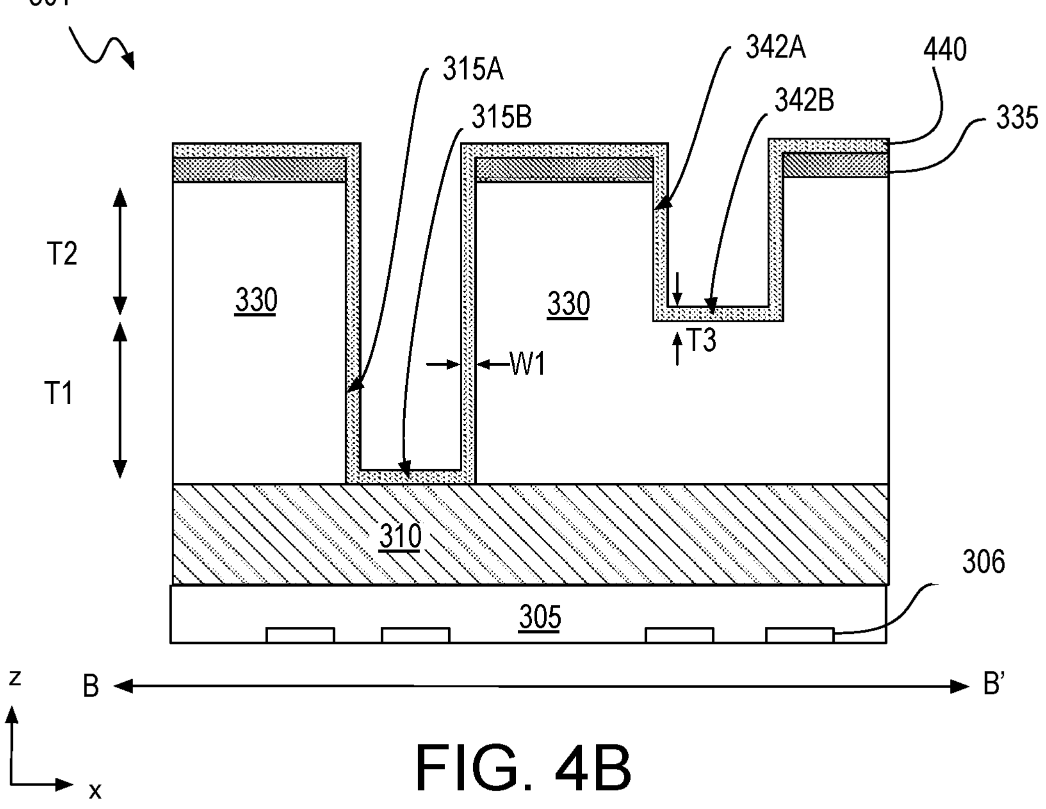

In the examples illustrated in FIG. 4A, a barrier material 440 has been formed over interconnect structure portion 301, and as further shown in FIG. 4B barrier material 440 is in direct physical contact with metallization feature 310 at via bottom 315. Barrier material 440 is also in direct physical contact with trench bottom 342B. Barrier material 440 is also in direct contact with a via sidewall 315A and trench sidewall 342. Although barrier material 440 is illustrated as being in direct contact with dielectric materials 330, in alternative embodiments one or more adhesion layer may be present between barrier material 440 and dielectric materials 330. Hence, via sidewall 315A and trench sidewall 342 may comprise dielectric materials 330, or may comprise another material layer in direct contact with dielectric materials 330.

In some examples, barrier material 440 is a substantially conformal film that has a lateral width W1 adjacent to via sidewall 315A that is within 20% of the thickness T3 on trench bottom 342B. Such conformality is may be achieved with an ALD process, a directed self-assembly process, or a chemical treatment process, for example. In some examples, the lateral width W1 is no more than 1.5 nm (i.e., barrier material 440 is a 2D material layer). Barrier material 440 may be substantially amorphous or may be polycrystalline.

In some embodiments, barrier material 440 includes at least one metal (M). In some embodiments, the metal is at least one of Cu, Ta, W, Mo, Ru, Cu or Al. For example, barrier material 440 may comprise Ta. Barrier material 440 may also comprise a metal compound that further includes at least one of Si, N, C, or O. For example, barrier material 440 may be $TaN_x$, $AlO_x$, etc. In some further embodiments, barrier material 440 includes a chalcogenide (C). In some embodiments, the chalcogenide is sulfur-based, which is an advantageously small atom with high mobility. In other embodiments, the chalcogenide is at least one of Se or Te. In some specific embodiments, barrier material 440 is a metal chalcogenide (i.e., $M_aX_bZ_c$) comprising predominantly one or more of the above listed metals, and one or more of the above chalcogenides. Although in some instances barrier material 440 may be a dichalcogenide ($MC_2$), a number of oxidation states are possible such that x may vary, for example between 0.2 and 4. Such a metal chalcogenide barrier material may have crystalline microstructure (i.e., long range atomic ordering) within a 2D plane of its monolayer(s). Diffusion barrier qualities of the metal chalcogenide may be attributable, at least in part, to the crystalline microstructure, enabling barrier material 440 to have minimal barrier material thickness T3 and/or lateral sidewall width W1.

In some other embodiments, barrier material 440 comprises graphene. A graphene barrier material may be polycrystalline, having grains of a wide variety of molecular weights, physical size (lateral widths and layer thicknesses), and bonding character. For such embodiments, barrier material 440 thickness may vary between grains from single monolayers to a few monolayers. Alternatively, the graphene may comprise molecular graphene (MG) including graphitic molecules of a highly uniform molecular weight, physical size, and bonding character (e.g., $sp^2$ with significant resonance). For molecular graphene embodiments, barrier material 440 may comprise a same molecular repeat unit functionalized, for example through hydration and/or a substitution reaction, so as to become adsorbed onto via sidewall 315A, via bottom 315B, trench sidewall 342A and trench bottom 342B. For molecular graphene embodiments, barrier material 440 thickness may be controlled to a highly uniform to 1-3 monolayers, for example.

In other embodiments, barrier material 440 comprises a dielectric, such as any of those described above for etch stop 335. For dielectric embodiments, barrier material 440 is substantially amorphous. In some embodiments, barrier material 440 is a dielectric having a higher relative permittivity than that of ILD materials 330. In some examples, barrier material is a silicon-based dielectric, for example comprising predominantly Si and at least one of O (e.g., $SiO_x$) or N (e.g., $SiN_x$, SiON).

With the barrier material formed in both trenches and vias of the interconnect structure, embodiments proceed with the formation of one or more mask materials over a portion of the barrier layer that is lining the trenches. For the examples illustrated by FIG. 2, methods 201 continue at block 215 where a mask fill material is deposited into the trenches and vias. The mask fill material may have any composition, but is advantageously deposited with a planarizing process that at least partially backfills both vias and trenches. Planarization of the mask fill material may then facilitate a subsequent lithographic via mask pattering process at block 220.

Figure 5A:
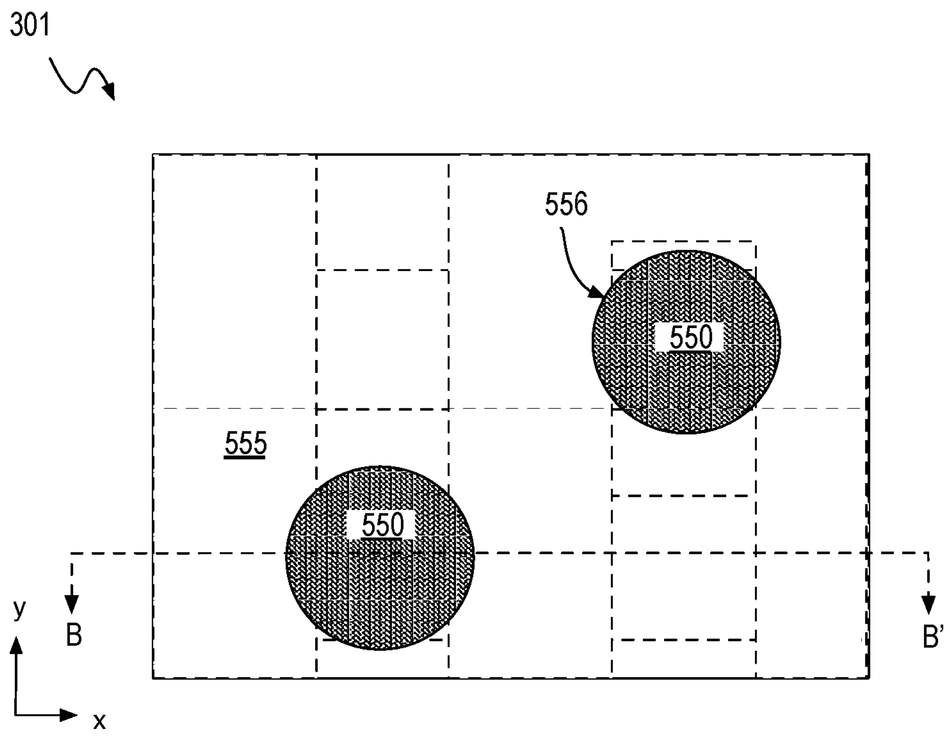
Figure 5B:
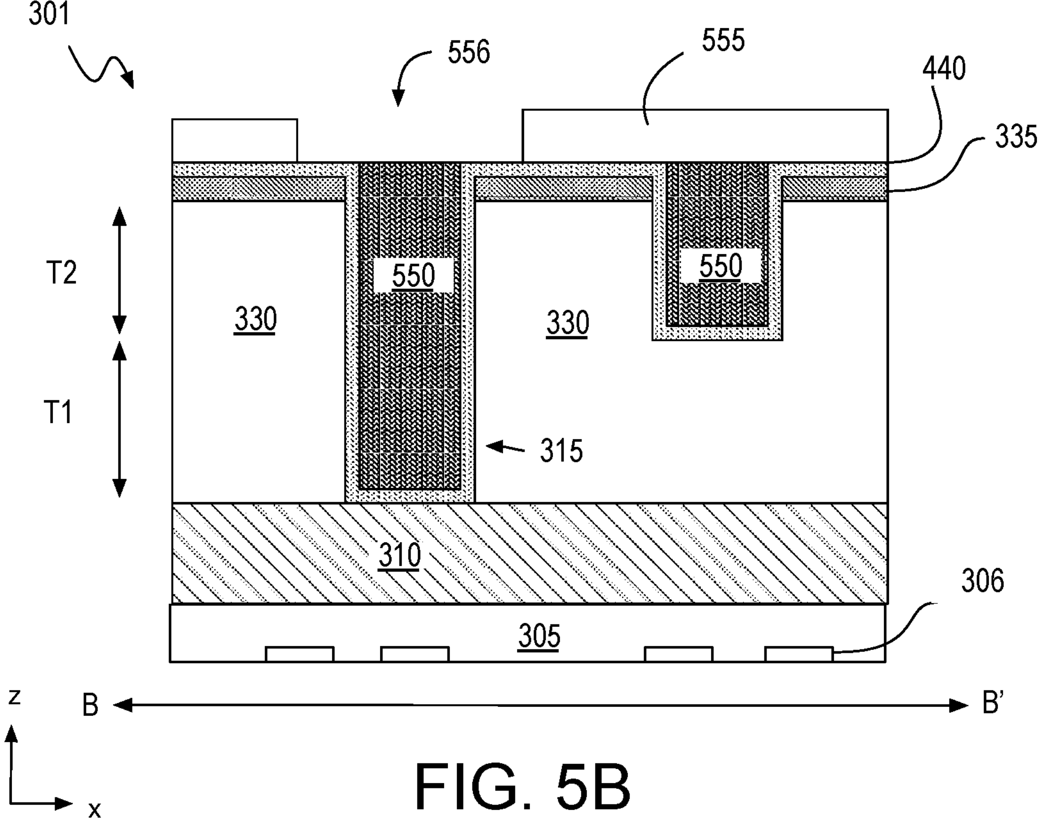
Figure 6A:
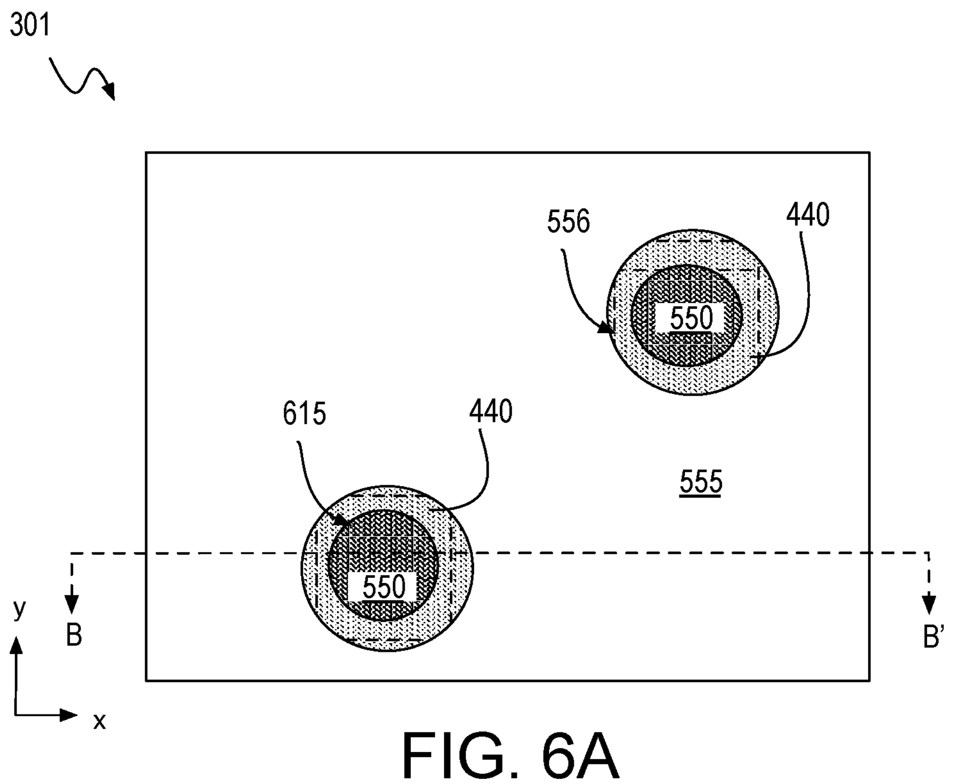
Figure 6B:
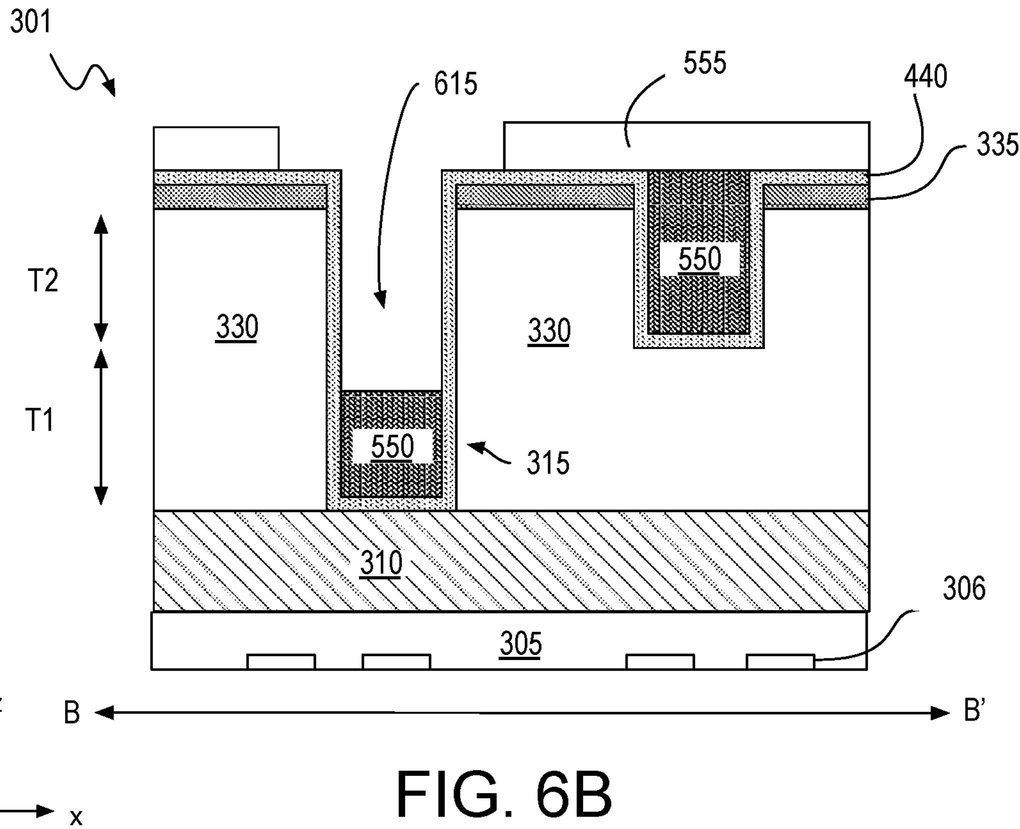

In the examples illustrated in FIG. 5A and FIG. 5B, a mask fill material 550 completely backfills both via 315 and trenches 341 and 342, substantially planarizing a top surface of the workpiece. The fill process may be planarizing, and/or a planarization process (e.g., CMP) may be performed after the fill process. In the illustrated example, mask fill material 550 is substantially planar with a top surface of trenches 341 and 342, although it need not be. In some embodiments, mask fill material 550 is a non-photosensitive carbonaceous material comprising predominantly carbon (i.e., carbon-based). In one example, mask fill material is diamond-like carbon (DLC). A via mask material 555 is formed over mask fill material 550, and patterned with via openings 556. Via mask material 555 may either be a photosensitive material that has been exposed and developed to have the via mask pattern, or via mask material 555 may be a dielectric hardmask material that has been patterned by an anisotropic etch to have the via mask pattern according to any overlying photolithographic mask material (not depicted). As shown in FIG. 5A and FIG. 5B, via openings 556 substantially overlap vias 315, but may have lateral dimensions significantly larger than the via diameter, for example to accommodate mask overlay error, etc. Although a dark field via mask pattern is illustrated, the via mask pattern may also be a bright field pattern that retains some minimal features of via mask material 555 located over trenches 341, 342.

A patterning of mask materials may continue as further illustrated in FIG. 2, where the mask fill material within the via is recessed, for example with an anisotropic etch process. The via recess etch may substantially clear the entire thickness of the mask fill material occupying a via, or may remove only a partial thickness of the mask fill material within a via. In the example further illustrated in FIGS. 6A and 6B, after a via recess 615, a partial thickness (less than T1) of mask fill material 550 remains at a bottom portion of via 315. Mask fill material has been completely removed in other regions where its thickness was less. Hence, some portions of barrier material 440 may be revealed during the via recess etch, for example where the via mask pattern overlaps etch stop material 335. Depending on the feature dimensions of the via pattern, some barrier material 440 at a bottom of a portion of a trench immediately adjacent to a via may also be exposed.

Following a via recess etch, the recovered via topography may then be leveraged for self-aligned patterning, which may supplement any of the mask material remaining after the via recess etch. In the examples illustrated in FIG. 2, methods 201 continue at block 230 where a spacer material is deposited over the workpiece. The spacer material may be advantageously deposited with a substantially conformal deposition process, such as, but not limited to ALD. In some examples, a deposition process suitable for forming a liner (e.g., adhesion layer, etc.) within via and trench structures is performed at block 230.

Figures 7A, 7B:
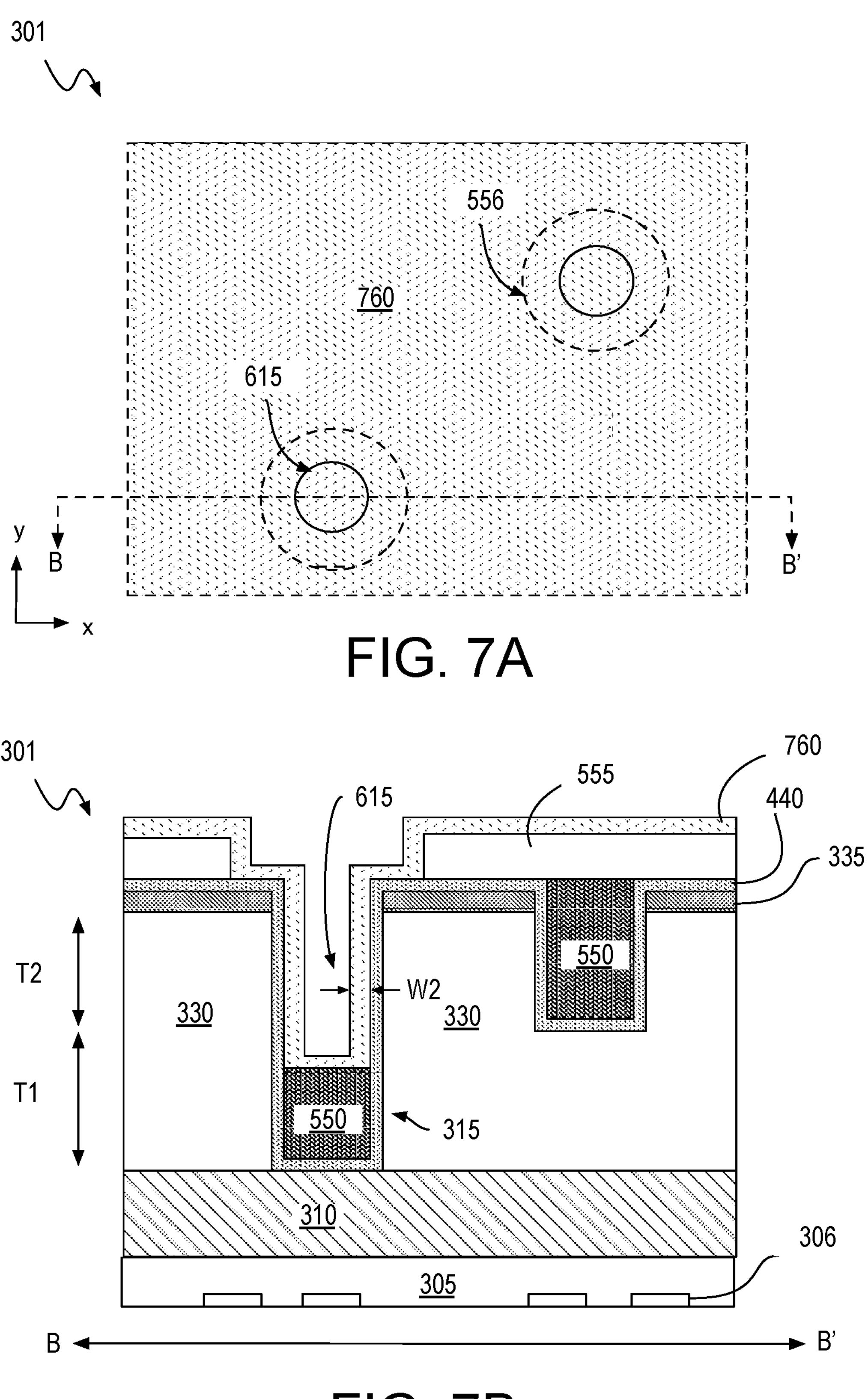

In the example further illustrated in FIGS. 7A and 7B, a spacer material 760 has been blanket deposited over interconnect structure portion 301. As shown, spacer material 760 is deposited to a thickness insufficient to fill, or pinch off, via recess 615. The diameter of via recess 615 decreases as a function of the lateral sidewall width of spacer material 760. Spacer material 760 may have any thickness suitable for the dimensions of the via dimensions. In some exemplary embodiments, spacer material 760 has a lateral width W2 as low as 1 nm. Spacer material 760 may have any composition amenable to forming a spacer, for example when subsequently etched with anisotropic etch process. Spacer material 760 advantageously has a composition that will facilitate it eventual removal as a sacrificial feature that is not retained in an interconnect structure. Spacer material 760 may, for example, have a composition distinct from barrier material 440. Spacer material 760 may also have a composition distinct from one or more of via mask material 555 and mask fill material 550. Spacer material 760 may, however, have substantially the composition as via mask material 550 (e.g., both carbon-based). Spacer material 760 may be predominantly a metal, such as one absent from barrier material 440. In some examples, spacer material 760 comprises predominantly Ti. Spacer material 760 may also be predominantly a dielectric material, such as any silicon-based dielectric, for those embodiments where barrier material 440 is not also the same dielectric material.

The self-aligned patterning process may then proceed with an etch of the spacer material that will generate a spacer self-aligned to topography of the via recess. As illustrated in FIG. 2, an optional spacer mask may be formed at block 235 prior to an etch of the spacer material. Block 235 is shown in dashed line to emphasize that the formation of a spacer mask is an optional feature of a spacer-based self-aligned patterning process. For embodiments where the spacer material deposition is highly conformal, process margins associated with the self-aligned patterning process may be increased through spacer mask material deposition that is topography dependent or otherwise selective to regions where barrier material is to be retained.

Figures 8A, 8B:
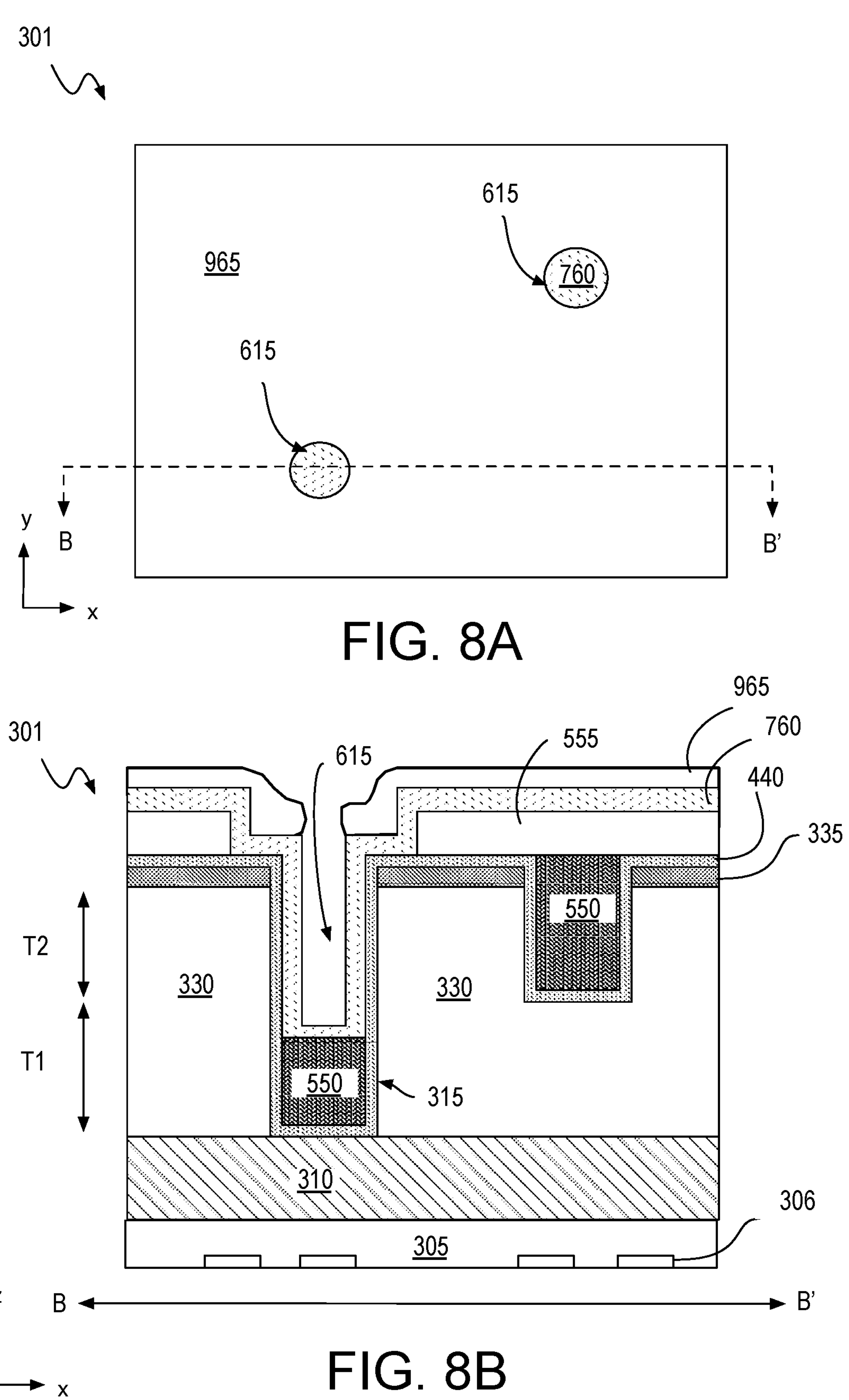

In the example further illustrated in FIGS. 8A and 8B, a spacer mask material 965 forms a "helmet" protective structure over regions outside of via recess 615. The helmet protective structure can be formed in a manner that laterally extends the patterned via mask material 555, supplementing it to ensure via recess 615 resides completely within the footprint of via 315. Spacer mask material 965 may have any composition and may be deposited by any process known to be suitable for this application. In some embodiments, a physical vapor deposition process is practiced. In other embodiments, an autocatalytic ALD or wet chemical process is employed. The composition of spacer mask material 965 may therefore vary widely, for example including metals, metallic compounds, and dielectrics.

Returning to FIG. 2, methods 201 continue at block 240 where the spacer material is etched. Any residual sacrificial material revealed by the spacer etch may also be etched at this point to complete the barrier material masking process. The etch process performed at block 240 is advantageously anisotropic so a spacer having a finite lateral width adjacent to a sidewall of the via is retained for protection of the barrier material. In the examples further illustrated in FIGS. 9A and 9B, via recess 615 has been advanced by etching through the thickness of spacer material 760 at the bottom of via 315 where it was not protected by spacer mask material 965 and not otherwise retained as a result of the sidewall topography of via 315. Any single-step or multi-step anisotropic reactive ion etch (RIE) process (e.g., based on a halogen plasma chemistry) may be practiced to etch through a thickness of spacer material 760 at a bottom of via recess 615, as embodiments are not limited in this respect. Depending on the anisotropy of the spacer etch, spacer material 760 may retain a lateral width W2 adjacent to a sidewall of via 315. Although lateral width W2 may vary, in some exemplary embodiments, lateral width W2 is at least 1 nm (e.g., 1-5 nm).

Figures 9A, 9B:
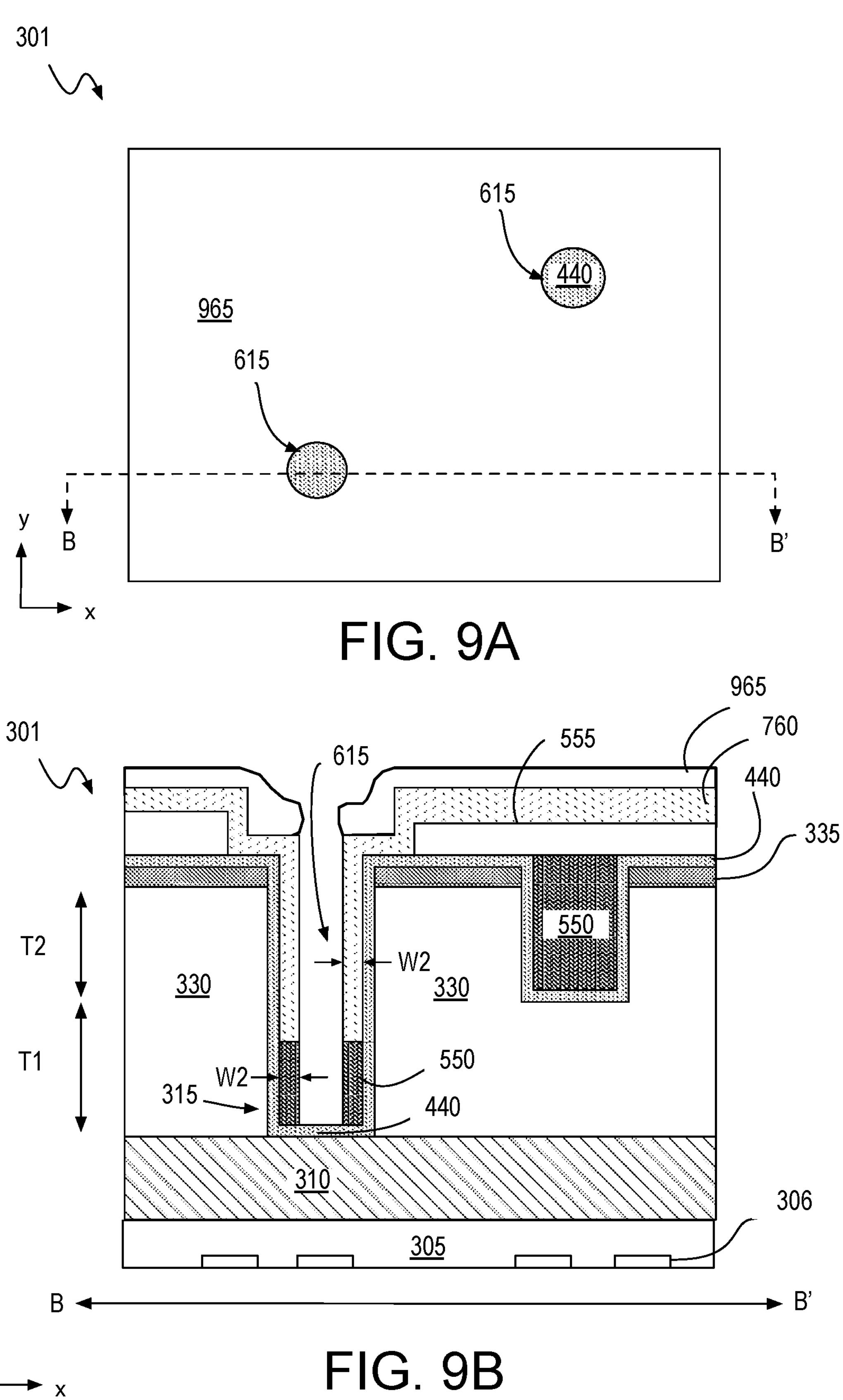
Figures 10A, 10B:
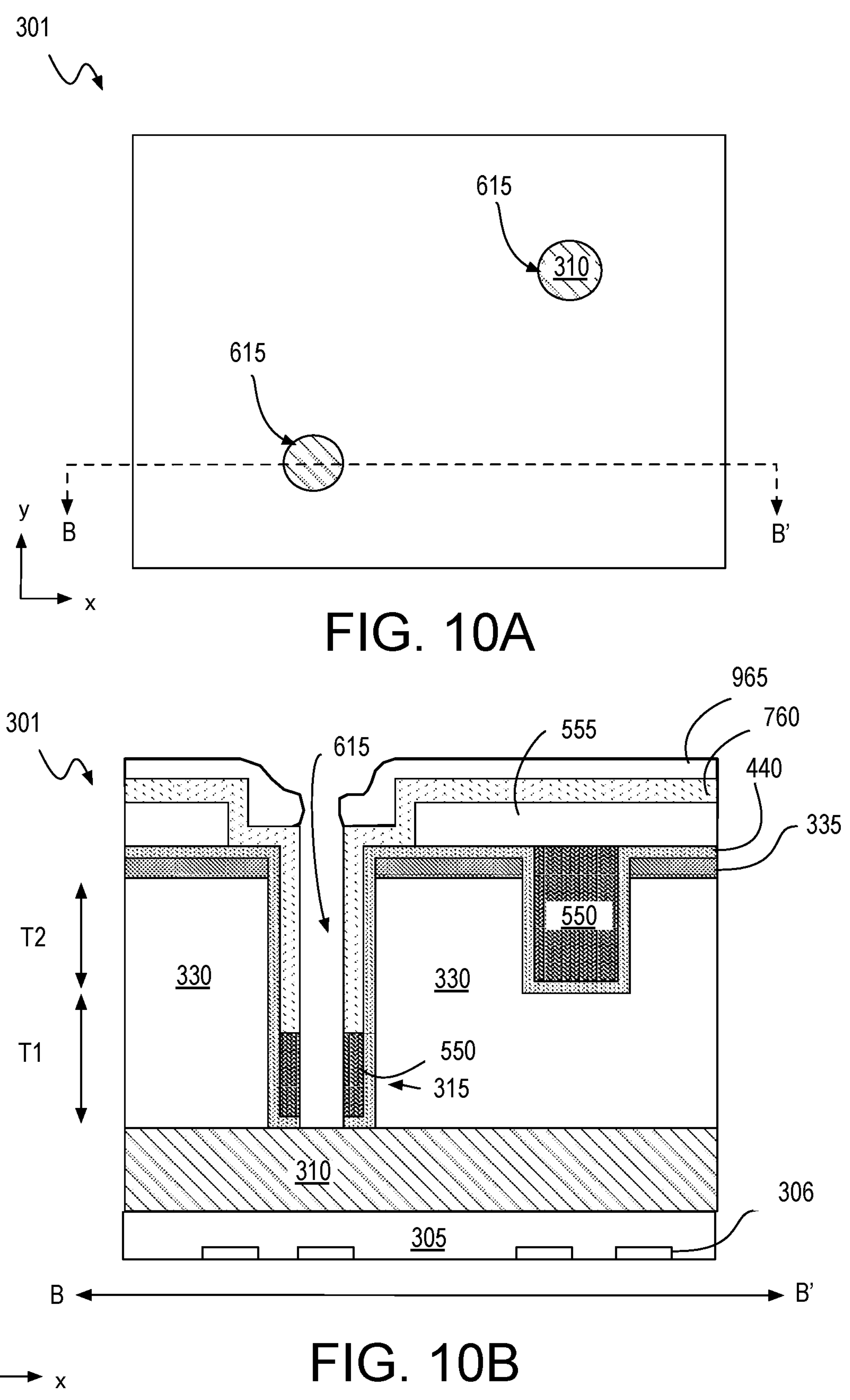

For embodiments where mask fill material 550 remains at a bottom of via 315, the thickness of mask fill material 550 exposed during the spacer material etch may also be etched anisotropically to further advance via recess 615 and expose barrier material 440 at a bottom of via 315, as illustrated in FIG. 9B. Mask fill material 550 may be etched with any anisotropic process suitable for the composition of mask fill material 550. For some exemplary embodiments where mask fill material is a carbon-based, an $O_2$-based etch process may be employed. The etch of mask fill material 550 may offer selectivity over spacer material 550 so that spacer material 550 serves as a self-aligned etch mask. The etch of mask fill material 550 may therefore also form a spacer of lateral width W2 adjacent to a bottom portion of via 315. Hence, a spacer of spacer material 760 adjacent to an upper portion of via 315 and a spacer of mask fill material 550 adjacent to a lower portion of via 315 serve as self-aligned mask materials protecting barrier material 440 adjacent to sidewalls of via 315. Barrier material 440 is however exposed at a bottom of via recess 615.

Returning to FIG. 2, methods 201 continue at block 245 where barrier material exposed at a bottom of a via recess is removed, for example with any etching process suitable for the composition of the barrier material. The etching process may be highly chemical or physical in character as a function of the barrier material composition. Noting the barrier layer may be only a few nanometers in thickness, a physical sputter process may be suitable to break through the barrier material and expose underlying metallization. However, a selective etch may also be performed if the barrier material is amenable to chemical etching. In the examples further illustrated in FIGS. 10A and 10B, barrier material 440 at the bottom of via recess 615 is removed to expose an area of metallization feature 310 not protected by spacer material 760 and/or mask fill material 550. Barrier material 440 is retained everywhere outside of the confines of via recess 615.

Figure 11A:
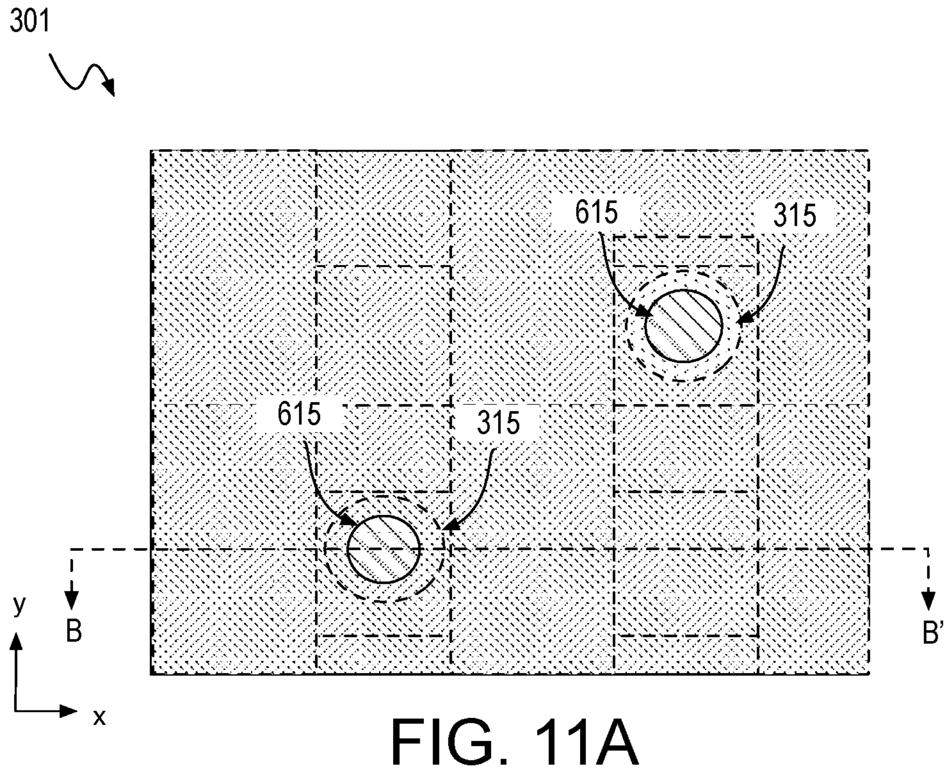
Figure 11B:
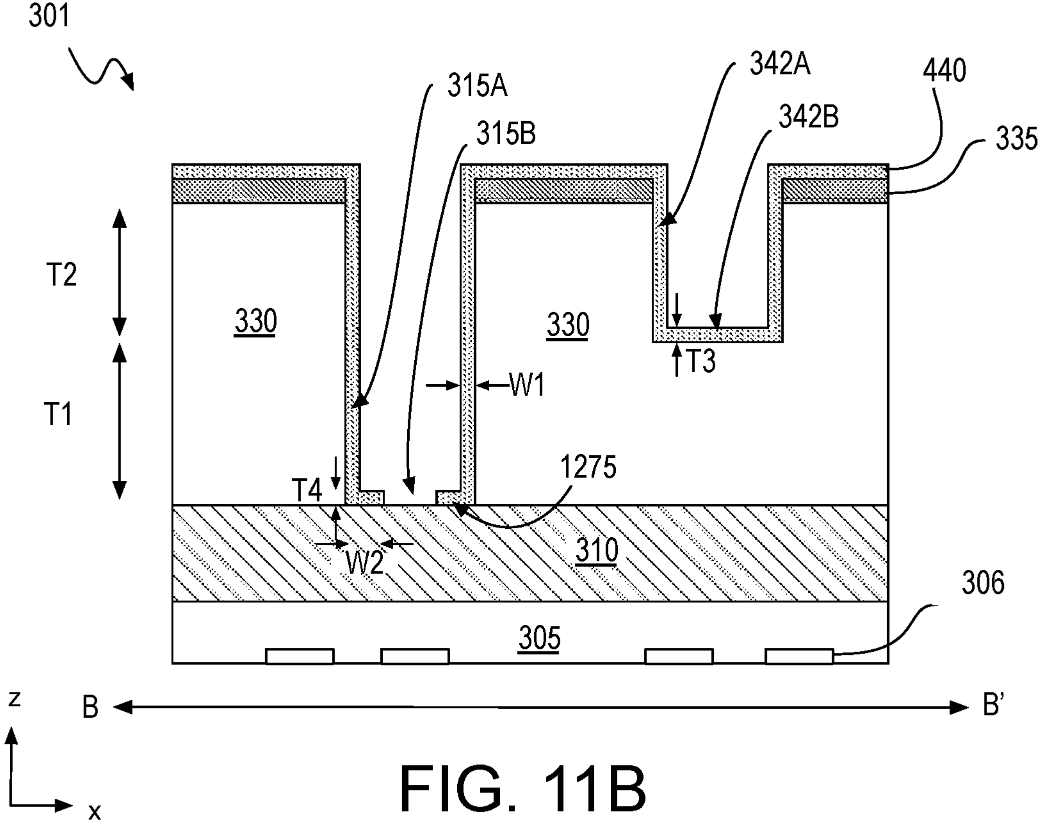

Returning to FIG. 2 with underlying line metallization now exposed, methods 201 may continue at block 250 with removal of the various masking material(s) enlisted to protect portions of the barrier material that are to be retained as permanent features of an IC interconnect structure. One or more selective etching processes may be practiced at block 250 to remove, or strip, the masking materials selectively to the barrier material and exposed line metallization. As shown in FIGS. 11A and 11B, the mask stripping process removes each of spacer mask material 965, spacer material 760, via mask material 555 and mask fill material 550 to fully recover trench and via topography that is substantially lined with barrier material 440. More specifically, barrier material 440 remains laterally adjacent to both trench sidewall 342A and trench bottom 342B. Barrier material 440 also remains laterally adjacent to via sidewall 315A. However, metallization feature 310 is exposed within at least a portion of via bottom 315B that is substantially free of barrier material 440.

As further illustrated in FIG. 11B, a foot 1275 of barrier material 440 remains at via bottom 315B. Barrier material foot 1275 is indicative of the self-aligned spacer-based masking process enlisted to pattern barrier material 440. As such, barrier material foot 1275 will have a lateral width W2 that is approximately equal to the lateral width of a spacer that masked an etch of the barrier material. Because the spacer mask lined a via recess sidewall, barrier material foot 1275 may have an annular structure, surrounding a perimeter of an area where metallization feature 310 is exposed. Lateral width W2 may therefore be 2-5 nm, for example. Lateral width W2 may be larger or smaller than the lateral width W1 of barrier material 440 adjacent to via sidewall 315A. Within the lateral width W2, barrier material foot 1275 has a thickness T4 over metallization feature 310.

Returning to FIG. 2, methods 201 continue at block 255 where the lined trench and via pattern is at least partially backfilled with line metallization and via metallization, respectively. The metallization backfill may proceed according to one or more deposition techniques, such as, but not limited to electrolytic plating. The metallization deposited may have any composition known to be suitable for IC interconnect structures. Following fill metal deposition, a top surface of the line metallization may be planarized, for example with any CMP process, so that lines of metallization have a coplanar top surface with surrounding dielectric material(s).

Figure 12A:
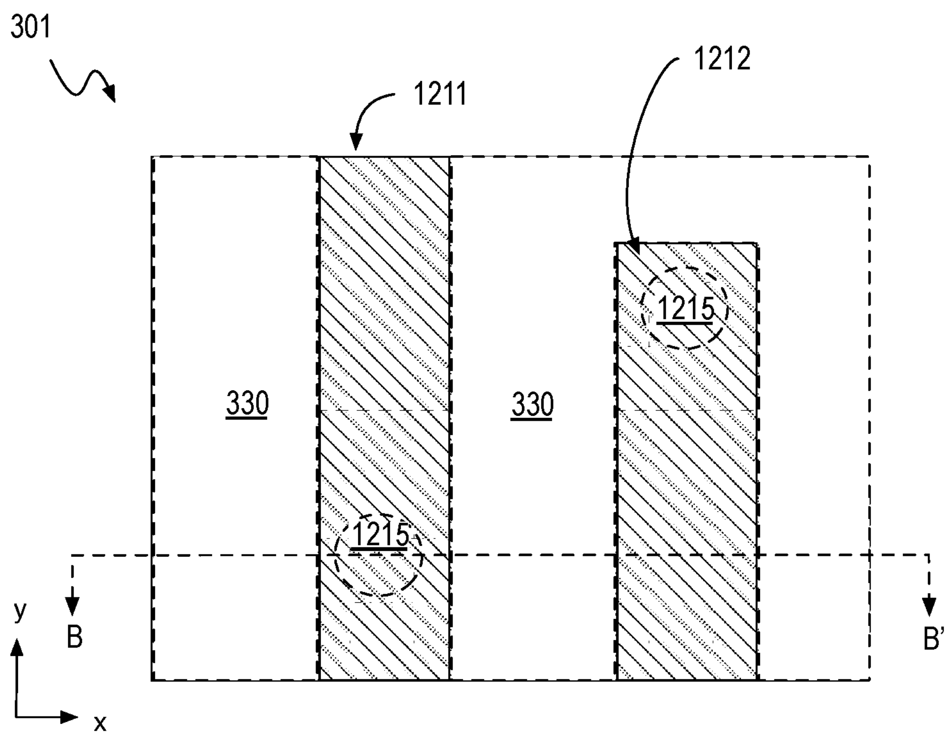
Figure 12B:
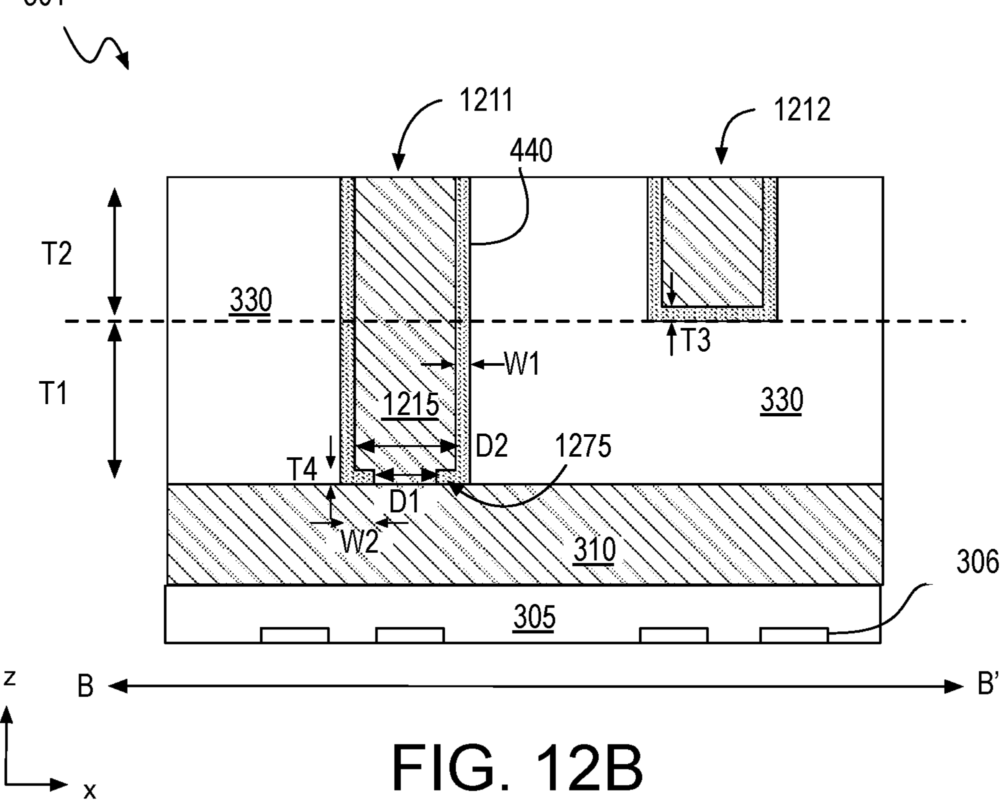

In the example further illustrated in FIGS. 12A and 12B, interconnect structure portion 301 includes line metallization 1211, 1212 and via metallization 1215. Line metallization 1211, 1212 has substantially the same metallization composition and/or structure as via metallization 1215, indicative of a dual-damascene process. For example, in some embodiments line metallization 1211, 1212 and via metallization 1215 include a same fill metal, such as copper, deposited, for example with an electrolytic plating process. As shown, via metallization 1215 is in direct contact with metallization feature 310, with no barrier material 440 therebetween (except where barrier material foot 1275 surrounds the fill metal). Because of barrier material foot 1275, the fill metal within via metallization 1215 has a smaller diameter D1 at bottom of via metallization 1215 where contact is made with metallization feature 310 (e.g., in copper-to-copper connection). Via metallization 1215 has a larger diameter D2 within an upper portion of via metallization 1215, above barrier material foot 1275. Line metallization 1211, 1212 comprises fill metal in direct physical contact with barrier material 440 at the bottom line metallization 1211, 1212 (e.g., between dielectric materials 330 and the fill metal).

Interconnect structure portion 301 may be incorporated into any IC circuitry as a portion of any IC chip or die that may be singulated from a workpiece following the completion of any conventional processing not further described herein. In the absence of barrier material at a bottom of the via metallization, the fill metal of via metallization may make direct contact with underlying line metallization, thereby reducing interconnect metallization resistance. IC circuitry may therefore display an lower RC delay and higher overall performance. An IC may also display lower power consumption and lower temperatures for a given level of performance.

Figure 13:
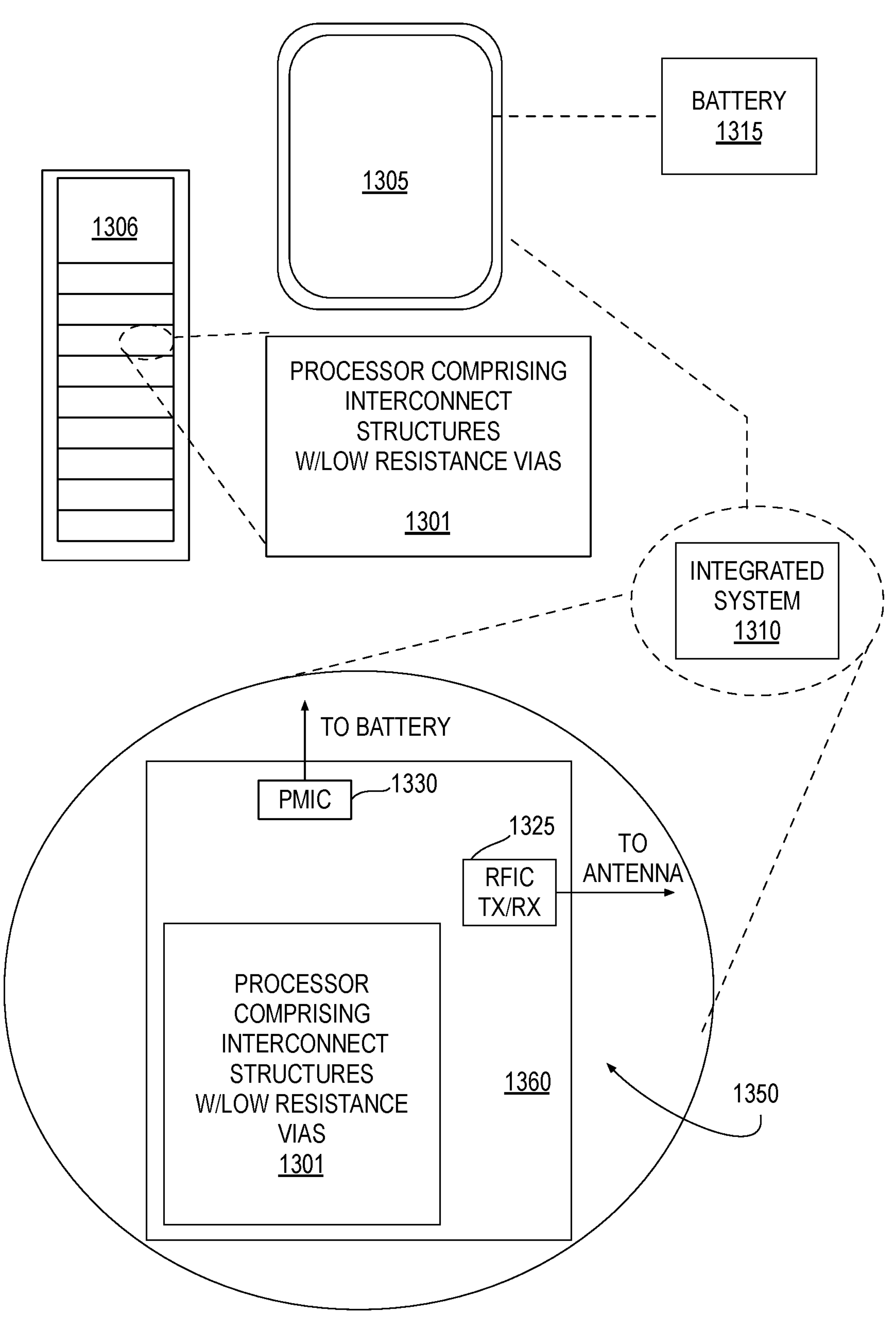
FIG. 13 illustrates a mobile computing platform and a data server machine employing an IC including an interconnect structure with low resistance vias, in accordance with some embodiments.

FIG. 13 illustrates a mobile computing platform 1305 and a data server computing platform 1306 employing an IC including interconnect structures with low resistance vias, for example as described elsewhere herein. The server platform 1306 may be any commercial server, for example including any number of high-performance computing platforms disposed within a rack and networked together for electronic data processing, which in the exemplary embodiment includes a microprocessor 1301 including interconnect structures with low resistance vias, for example as described elsewhere herein.

The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen), a chip-level or package-level integrated system 1310, and a battery 1315. At least one IC of chip-level or package-level integrated system 1310 includes an interconnect structure with low resistance vias, for example as described elsewhere herein. In the example shown in expanded view 1350, integrated system 1310 includes microprocessor 1301 including interconnect structures with low resistance vias, for example as described elsewhere herein. Microprocessor 1350 may be further coupled to a board 1360, a substrate, or an interposer. One or more of a microcontroller 1335, a power management integrated circuit (PMIC) 1330, or an RF (wireless) integrated circuit (RFIC) 1325 including a wideband RF (wireless) transmitter and/or receiver (TX/RX) may be further coupled to board 1360.

Functionally, PMIC 1330 may perform battery power regulation, DC-to-DC conversion, etc., and so has an input coupled to battery 1315 and with an output providing a current supply to other functional modules (e.g., microprocessor 1350). As further illustrated, in the exemplary embodiment, RFIC 1325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 14:
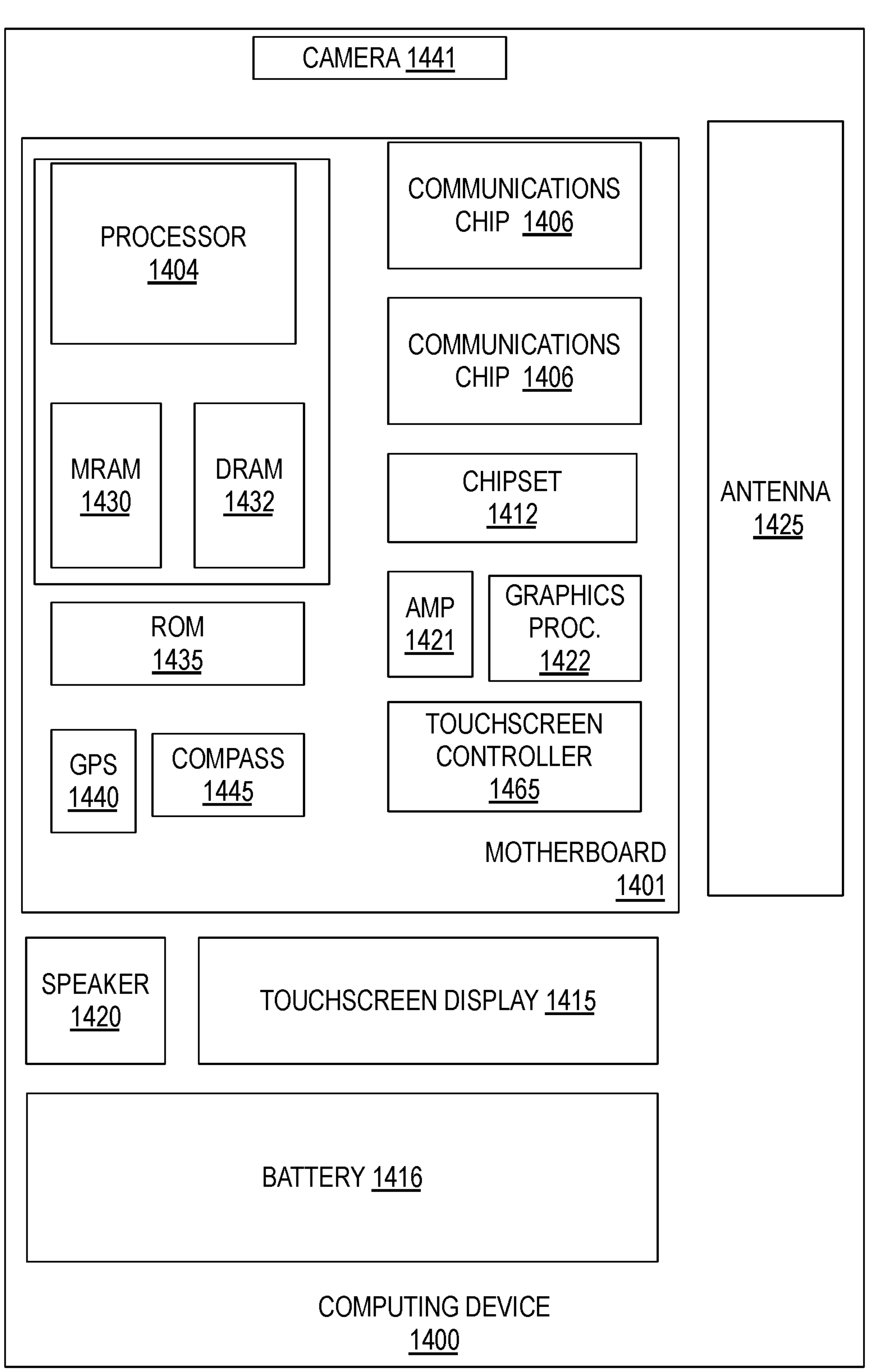
FIG. 14 is a functional block diagram of an electronic computing device, in accordance with some embodiments.

FIG. 14 is a functional block diagram of an electronic computing device 1400, in accordance with an embodiment of the present invention. Computing device 1400 may be found inside platform 1305 or server platform 1306, for example. Device 1400 further includes a motherboard 1402 hosting a number of components, such as, but not limited to, a processor 1404 (e.g., an applications processor). Processor 1404 may be physically and/or electrically coupled to motherboard 1402. In some examples, processor 1404 includes interconnect structures with low resistance vias, for example as described elsewhere herein. In general, the term “processor” or “microprocessor” may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1402. In further implementations, communication chips 1406 may be part of processor 1404. Depending on its applications, computing device 1400 may include other components that may or may not be physically and electrically coupled to motherboard 1402. These other components include, but are not limited to, volatile memory (e.g., DRAM 1432), non-volatile memory (e.g., ROM 1435), flash memory (e.g., NAND or NOR), magnetic memory (MRAM 1430), a graphics processor 1422, a digital signal processor, a crypto processor, a chipset 1412, an antenna 1425, touchscreen display 1415, touchscreen controller 1465, battery 1416, audio codec, video codec, power amplifier 1421, global positioning system (GPS) device 1440, compass 1445, accelerometer, gyroscope, speaker 1420, camera 1441, and mass storage device (such as hard disk drive, solid-state drive (SSD), compact disk (CD), digital versatile disk (DVD), and so forth), or the like. In some exemplary embodiments, at least one of the functional blocks noted above include interconnect structures with low via resistance, for example as described elsewhere herein.

Communication chips 1406 may enable wireless communications for the transfer of data to and from the computing device 1400. The term “wireless” and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, including but not limited to those described elsewhere herein. As discussed, computing device 1400 may include a plurality of communication chips 1406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example the above embodiments may include specific combinations of features as further provided below.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A integrated circuit (IC) interconnect structure, comprising:

a first line metallization;

a via metallization comprising a fill metal in direct physical contact with the first line metallization over an area including a center of a bottom of the via metallization, and comprising a barrier material in direct physical contact with a sidewall of the fill metal and encircling the area including the center of the bottom of the via metallization; and a second line metallization over, and coupled to, the first line metallization through the via metallization, wherein the barrier material is at a bottom of the second line metallization, and the second line metallization comprises the fill metal in direct physical contact with the barrier material at the bottom of the second line metallization.

2. The IC interconnect structure of claim 1, wherein the barrier material comprises at least one of graphene or a metal chalcogenide.

3. The IC interconnect structure of claim 1, wherein the barrier material within an upper portion of the via metallization has a lateral width of less than 1.5 nm adjacent to the sidewall of the fill metal.

4. The IC interconnect structure of claim 1, wherein:

a foot of the barrier material is in direct physical contact with the first line metallization over a second area at the bottom of the via metallization, wherein the second area encloses the area including the center of the bottom of the via metallization.

5. The IC interconnect structure of claim 4, wherein the foot of barrier material has a lateral width of at least 2 nm, and wherein the barrier material within an upper portion of the via metallization has a lateral width of less than 1.5 nm adjacent to the sidewall of the fill metal.

6. The IC interconnect structure of claim 4, wherein the foot of barrier material has a thickness between the fill metal and the first line metallization substantially equal to a thickness of the barrier material at the bottom of the second line metallization.

7. The IC interconnect structure of claim 1, further comprising one or more interlayer dielectric (ILD) materials, wherein the via metallization is within a first thickness of the ILD materials and the second line metallization is within a second thickness of the ILD materials, and wherein the barrier material is between the ILD materials and the fill metal, and wherein the barrier material has a higher relative permittivity than the ILD materials.

8. The IC interconnect structure of claim 1, wherein the first line metallization comprises copper and the fill metal comprises copper.

9. An integrated circuit (IC) structure, comprising:

a device layer comprising a plurality of transistors comprising one or more semiconductor materials; and a plurality of interconnect levels, the interconnect levels further comprising:

a first line metallization coupled to a terminal of one or more of the transistors;

a via metallization comprising a fill metal in direct physical contact with the first line metallization over an area including a center of a bottom of the via metallization, and comprising a 2D barrier material in direct physical contact with a sidewall of the fill metal and encircling the area at the center of the bottom of the via metallization, wherein the 2D barrier material comprises a metal chalcogenide or graphene; and a second line metallization over, and coupled to the first line metallization through the via metallization, wherein the 2D barrier material is at a bottom of the second line metallization, and the second line metallization comprises the fill metal in direct physical contact with the 2D barrier material at the bottom of the second line metallization.

10. A computer platform comprising:

a power supply; and the IC structure of claim 9 coupled to the power supply.

11. The IC structure of claim 9, wherein the first line metallization comprises copper and the fill metal comprises copper.

12. The IC structure of claim 11, wherein the barrier material within an upper portion of the via metallization has a lateral width of less than 1.5 nm adjacent to the sidewall of the fill metal.

13. The IC structure of claim 12, wherein:

the fill metal is in direct physical contact with the first line metallization over the area including the center of the bottom of the via metallization; and a foot of the barrier material is in direct physical contact with the first line metallization over a second area at the bottom of the via metallization, wherein the second area encloses the area including the center of the bottom of the via metallization, and the foot of barrier material has a lateral width of at least 2 nm.

14. The IC structure of claim 13, wherein the foot of barrier material has a thickness between the fill metal and the first line metallization that is substantially equal to a thickness of the barrier material at the bottom of the second line metallization.

* * * * *